United States Patent
Zembower

(10) Patent No.: US 12,198,905 B2
(45) Date of Patent: Jan. 14, 2025

(54) MULTI RACETRACK CATHODIC ARC

(71) Applicant: Vapor Technologies, Inc., Longmont, CO (US)

(72) Inventor: Zachary Zembower, Northglenn, CO (US)

(73) Assignee: Vapor Technologies, Inc., Longmont, CO (US)

( * ) Notice: Subject to any disclaimer, the term of this patent is extended or adjusted under 35 U.S.C. 154(b) by 276 days.

(21) Appl. No.: 17/554,589

(22) Filed: Dec. 17, 2021

(65) Prior Publication Data

US 2023/0197425 A1   Jun. 22, 2023

(51) Int. Cl.
 *H01J 37/32* (2006.01)
 *C23C 14/32* (2006.01)
 *C23C 14/54* (2006.01)

(52) U.S. Cl.
 CPC ...... *H01J 37/32669* (2013.01); *C23C 14/325* (2013.01); *C23C 14/54* (2013.01); *H01J 37/32064* (2013.01); *H01J 37/32568* (2013.01); *H01J 37/32614* (2013.01)

(58) Field of Classification Search
 CPC ........... H01J 37/32568; H01J 37/32614; H01J 37/32669; H01J 37/32064; H01J 37/32055; C23C 14/325; C23C 14/54
 See application file for complete search history.

(56) References Cited

U.S. PATENT DOCUMENTS

| 10,811,239 B2 * | 10/2020 | Vetter ............... H01J 37/32669 |
| 2010/0213054 A1 | 8/2010 | Wu et al. |
| 2020/0240002 A1 | 7/2020 | Zimmer et al. |

FOREIGN PATENT DOCUMENTS

| EP | 0492592 A1 | 7/1992 | |
| EP | 658634 A1 * | 6/1995 | ........... C23C 14/325 |
| EP | 2866246 A1 | 4/2015 | |
| WO | WO-2013083495 A1 * | 6/2013 | ......... C23C 14/0605 |

OTHER PUBLICATIONS

EP Search Report dated May 19, 2023 for European Appn. No. 22213634.3, 7 pgs.

* cited by examiner

*Primary Examiner* — Michael A Band
(74) *Attorney, Agent, or Firm* — Brooks Kushman P.C.

(57) ABSTRACT

An arc deposition system includes a coating chamber and a central cathode target disposed within the coating chamber. At least two anodes surround the central cathode target. Each anode is positively biased with respect to the central cathode target such that each anode independently induces an associated racetrack erosion profile on the central cathode target. At least two magnetic components are located within the central cathode target. The magnetic components guide an associated arc that forms its associated racetrack erosion profile. Characteristically, each anode of the at least two anodes has an associated magnetic component.

10 Claims, 2 Drawing Sheets

MULTI RACETRACK CATHODIC ARC

TECHNICAL FIELD

In at least one aspect, a cathodic arc coating system using cathodic arc sources with multiple racetracks that can be simultaneously generated is provided.

BACKGROUND

Increasing deposition rates in arc deposition will also be desirable. Currently, there are magnetically confined cathodic arc sources available with exactly one active racetrack. Currently, increasing the number of racetracks to increase deposition is not available. All available magnetically confined cathodic arc sources with multiple racetracks only use one at a time, with the single arc spot jumping randomly between them.

Accordingly, there is a need for improved arc deposition systems that utilize multiple racetracks in a more effective manner.

SUMMARY

In at least one aspect, an arc deposition system is provided. The arc deposition system includes a coating chamber and a central cathode target disposed within the coating chamber. At least two anodes surround the central cathode target. Each anode is positively biased with respect to the central cathode target such that each anode independently induces an associated racetrack erosion profile on the central cathode target. At least two magnetic components are positioned within the central cathode target. The at least two magnetic components guide an associated arc that forms the associated racetrack erosion profile. Characteristically, each anode of the at least two anodes has an associated magnetic component.

In another aspect, an arc deposition system that includes two anodes is provided. The arc deposition system includes a coating chamber, a central cathode target, disposed within the coating chamber, a first anode, and a second anode. Characteristically, the first anode and the second anode surround the central cathode target. The first anode is positively biased with respect to the central cathode target such that the first anode induces a first racetrack erosion profile on the central cathode target. Similarly, the second anode is positively biased with respect to the central cathode target such that the second anode induces a second racetrack erosion profile on the central cathode target. A first magnetic component for guiding a first arc forms the first racetrack erosion profile and a second magnetic component for guiding a second arc forms the second racetrack erosion profile. Characteristically, the first magnetic component and the second magnetic component are located within the central cathode target.

In another aspect, the problems of the prior art with respect to multiple racetrack erosion profiles is solved by the separation of the current paths between racetracks.

In another aspect, two current sources are attached to a singular cathodic target. Instead of using the chamber wall as an anode, two separate anodes are attached facing their respective racetrack erosion profiles. This geometric difference is what makes each current path prefer their respective racetrack erosion profiles. This concept can be expanded to any number of racetrack erosion profiles.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

For a further understanding of the nature, objects, and advantages of the present disclosure, reference should be had to the following detailed description, read in conjunction with the following drawings, wherein like reference numerals denote like elements and wherein.

DETAILED DESCRIPTION

Figure 1A:
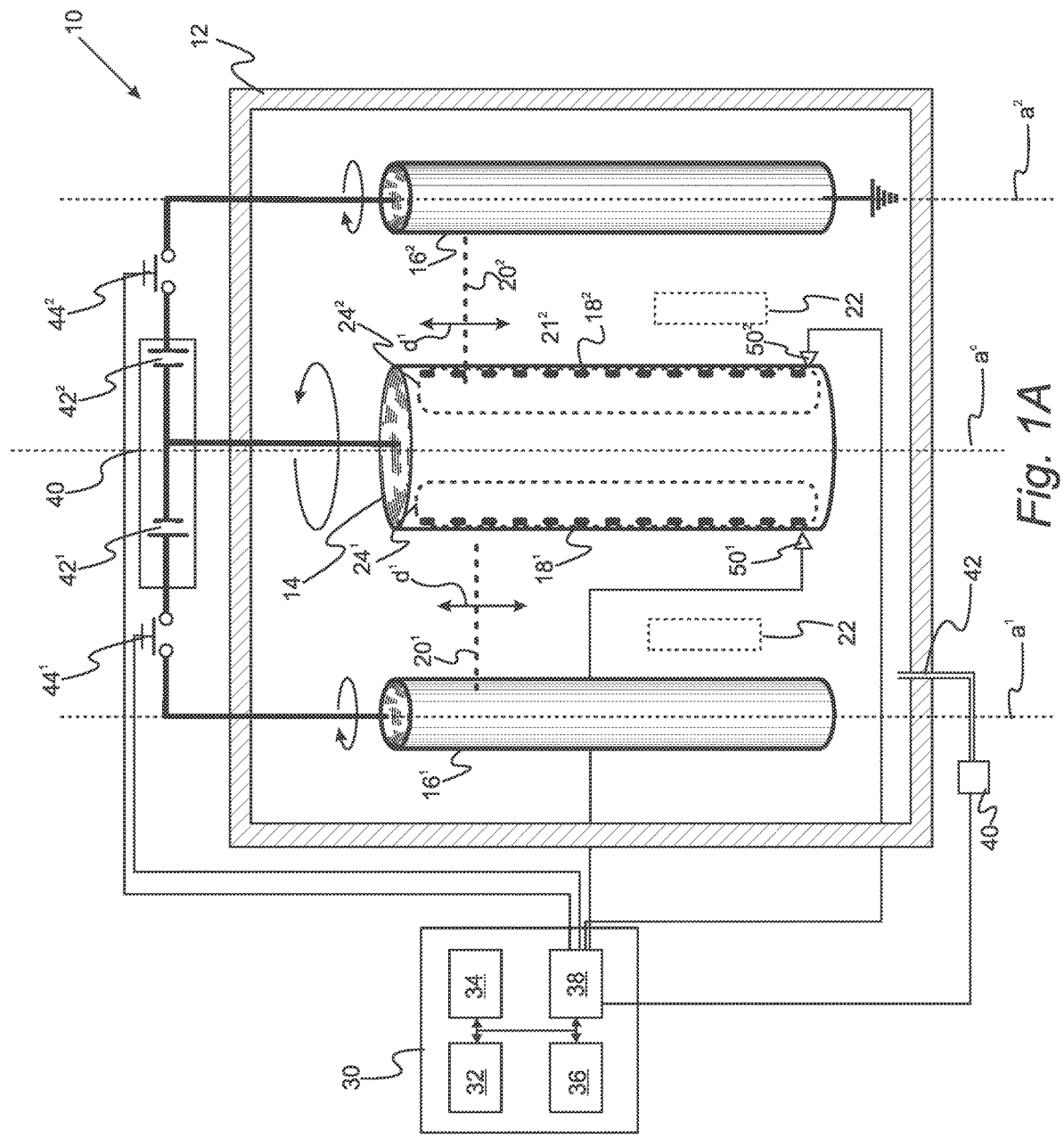
FIG. 1A. Schematic of a cathodic arc deposition system having arc spots forming two racetrack erosion profiles.

Reference will now be made in detail to presently preferred embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

It should also be appreciated that integer ranges explicitly include all intervening integers. For example, the integer range 1-10 explicitly includes 1, 2, 3, 4, 5, 6, 7, 8, 9, and 10. Similarly, the range 1 to 100 includes 1, 2, 3, 4 . . . 97, 98, 99, 100. Similarly, when any range is called for, intervening numbers that are increments of the difference between the upper limit and the lower limit divided by 10 can be taken as alternative upper or lower limits. For example, if the range is 1.1. to 2.1 the following numbers 1.2, 1.3, 1.4, 1.5, 1.6, 1.7, 1.8, 1.9, and 2.0 can be selected as lower or upper limits.

When referring to a numerical quantity, in a refinement, the term "less than" includes a lower non-included limit that is 5 percent of the number indicated after "less than." A lower non-includes limit means that the numerical quantity being described is greater than the value indicated as a lower non-included limited. For example, "less than 20" includes a lower non-included limit of 1 in a refinement. Therefore, this refinement of "less than 20" includes a range between 1 and 20. In another refinement, the term "less than" includes a lower non-included limit that is, in increasing order of preference, 20 percent, 10 percent, 5 percent, 1 percent, or 0 percent of the number indicated after "less than."

With respect to electrical devices, the term "connected to" means that the electrical components referred to as connected to are in electrical communication. In a refinement, "connected to" means that the electrical components referred to as connected to are directly wired to each other. In another refinement, "connected to" means that the electrical components communicate wirelessly or by a combination of wired and wirelessly connected components. In another refinement, "connected to" means that one or more additional electrical components are interposed between the electrical components referred to as connected to with an electrical signal from an originating component being processed (e.g., filtered, amplified, modulated, rectified, attenuated, summed, subtracted, etc.) before being received to the component connected thereto.

The term "electrical communication" means that an electrical signal is either directly or indirectly sent from an originating electronic device to a receiving electrical device. Indirect electrical communication can involve processing of the electrical signal, including but not limited to, filtering of the signal, amplification of the signal, rectification of the signal, modulation of the signal, attenuation of the signal, adding of the signal with another signal, subtracting the signal from another signal, subtracting another signal from the signal, and the like. Electrical communication can be accomplished with wired components, wirelessly connected components, or a combination thereof.

The term "one or more" means "at least one" and the term "at least one" means "one or more." The terms "one or more" and "at least one" include "plurality" as a subset.

The term "substantially," "generally," or "about" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

The term "electrical signal" refers to the electrical output from an electronic device or the electrical input to an electronic device. The electrical signal is characterized by voltage and/or current. The electrical signal can be stationary with respect to time (e.g., a DC signal) or it can vary with respect to time.

The terms "DC signal" refer to electrical signals that do not materially vary with time over a predefined time interval. In this regard, the signal is DC over the predefined interval. "DC signal" includes DC outputs from electrical devices and DC inputs to devices.

The term "electronic component" refers is any physical entity in an electronic device or system used to affect electron states, electron flow, or the electric fields associated with the electrons. Examples of electronic components include, but are not limited to, capacitors, inductors, resistors, thyristors, diodes, transistors, etc. Electronic components can be passive or active.

The term "electronic device" or "system" refers to a physical entity formed from one or more electronic components to perform a predetermined function on an electrical signal.

It should be appreciated that in any figures for electronic devices, a series of electronic components connected by lines (e.g., wires) indicates that such electronic components are in electrical communication with each other. Moreover, when lines directed connect one electronic component to another, these electronic components can be connected to each other as defined above.

The term "electrical communication" means that an electrical signal is either directly or indirectly sent from an originating electronic device to a receiving electrical device. Indirect electrical communication can involve processing of the electrical signal, including but not limited to, filtering of the signal, amplification of the signal, rectification of the signal, modulation of the signal, attenuation of the signal, adding of the signal with another signal, subtracting the signal from another signal, subtracting another signal from the signal, and the like. Electrical communication can be accomplished with wired components, wirelessly connected components, or a combination thereof.

With reference to FIG. 1A, a schematic of a cathode arc deposition system is provided. Arc deposition system 10 includes a coating chamber 12. In a refinement, arc deposition system 10 is a cathode arc deposition system. Central cathode target 14 is disposed in the coating chamber 10 and surrounded by at least two anodes $16^i$, where is an integer label running from 1 to the total number of anodes which is at least 2. In a refinement, the at least two anodes $16^i$ includes only include 2, 3, 4, or 5 or more anodes. It should be appreciated that the at least two anodes $16^i$ are used as anodes instead of the chamber wall. For example, a system with two anodes includes anodes $16^1$ and $16^2$. Central cathode target 14 can be located at the center of coating chamber 12. In a refinement, central cathode target 14 rotates about longitudinal axis $a^c$ running along the long direction of central cathode target 14. In a refinement, the anodes rotate in the opposite direction than the central cathode target. Typically, anodes are equally spaced around the central cathode target. For example, when there are two anodes, each anode will be separated by an angle of about 180 with respect to longitudinal axis $a^c$.

Advantageously. each anode is positively biased with respect to the central cathode target 14 such that each anode independently induces an associated racetrack erosion profiles $18^i$ (e.g., profiles $18^1$ and $18^2$ for two anodes) on the central cathode target. In this regard, arcs $20^i$ (e.g., arcs $20^1$ and $20^2$ for two anodes) associated with each racetrack erosion profile moves up and down along directions $d^1$ and $d^2$, respectively. In a refinement, directions $d^i$ (e.g., $d^1$ and $d^2$ for two anodes) are parallel to the longitudinal axes (e.g., $a^1$, $a^2$ for two anodes) through anodes $16^i$ (e.g., anodes $16^1$ and $16^2$ for two anodes).

Figure 1B:
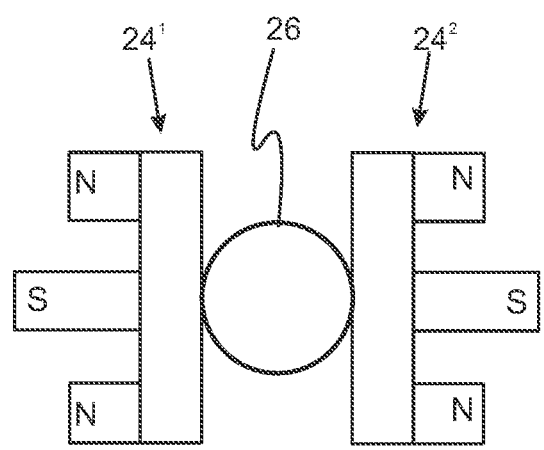
FIG. 1B. Top view of a magnetic component for guiding arcs to form associated racetrack erosion profiles.

Referring to FIG. 1B, magnetic components $24^i$ (e.g., magnetic components $24^1$ and $24^2$ for two anodes) are located within central cathode target 14. Magnetic components $24^i$ can be mounted on support 26. In a refinement, central cathode target 14 is rotatable with respect to magnetic components 24$^i$. Typically, arcs are moved along directions d$^i$ with magnetic components 24$^i$. The erosion pattern caused by the motion of these arcs over the surface of central cathode target 14 is referred to as "racetrack erosion profiles." The substrates 22 to be coated are positioned in coating chamber 12 at locations that do not interfere with arcs 20$^i$ (e.g., arcs 20$^1$ and 20$^2$ for two anodes) associated with each racetrack erosion profile. In a refinement, each of the magnetic components 24$^i$ includes bars of permanent magnets arranged along the long central axis of central cathode target 14. In a refinement, the magnetic field strength of magnetic components 24$^i$ is from about 10 to 200 Gauss. FIG. 1B depicts an example with three magnetic bars with a central magnetic bar arranged in the opposite sense with respect to the magnetic poles (e.g., north-south) to the two outer magnetic bars.

In a variation, arc deposition system 10 includes a controller 30 that controls the various controllable components described below. Typically, controller 30 includes a central processing unit 32 in electrical communication with computer memory 34 and peripheral interface 36 for connecting computer components such as a mouse, keyboard, monitor, external memory, and the like. In a refinement, controller 30 can also include one or more interface cards or devices for sending electrical signals controllable components. In one variation, controller 30 is configured to simultaneously activate each anode. In another variation, controller 30 is configured to activate the at least two anodes in an alternating manner.

Characteristically, coating chamber 12 is a vacuum coating chamber. Coating chamber 12 is maintained at reduced pressure during coating of a substrate via suitable vacuum system 40 in fluid communication with coating chamber 12 via port 42. Typically, operating pressures are between 0.5 and 50 mTorr. It should be noted that fully reacted coatings can be realized above approximately 1 mTorr. In a refinement, the vacuum system can be controlled by controller 30.

Arc deposition system 10 can include a power supply system 40 for biasing each of the at least two anodes 16$^i$ with respect to the central cathode target 12. In a refinement, the power supply system 40 includes power supply subsystems 42$^i$ (e.g., subsystems 42$^1$ and 42$^2$ for two anodes) to positively bias each anode of the at least two anodes with respect to the central cathode target. In a refinement, each of the at least two anodes 16$^i$ is positively biased with respect to the central cathode target 12 with a DC voltage between −15 and −50 volts. The power supply system 40 can also be viewed as providing multiple current sources (one for each anode) that are attached to a singular cathodic target 14. In a further refinement, a current from 100 to 600 amps flows through each anode. In a refinement, controller 30 can vary the current input each anode while maintaining the total arc current substantially constant. In a refinement, controller 20 can send to control signals to switches 44$^i$, with each anode 16$^i$ having an associated switch for selecting which anode and the associated racetrack is to be activated. In this regard, controller 30 will send power control signals to switches 44$^i$ (e.g., switches 44$^1$ and 44$^2$ for two anodes) to make the selection. Arc deposition system 10 can be operated with all the anodes simultaneously activated or with the anodes be activated in an alternating manner. For the case where there are anodes 16$^1$ and 16$^2$, both anodes can be simultaneously activated. Alternatively, activation can alternate between anode 16$^1$ and anode 16$^2$. Typically, a striker 50$^i$ (e.g., strikers 50$^1$ and 50$^2$ for two anodes) is associated with each anode 16$^i$.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An arc deposition system comprising:
   a coating chamber;
   a central cathode target and a substrate disposed within the coating chamber;
   a first anode;
   a second anode, the first anode and the second anode surrounding the central cathode target, the first anode being positively biased with respect to the central cathode target such that the first anode induces a first racetrack erosion profile on the central cathode target, the second anode being positively biased with respect to the central cathode target such that the second anode induces a second racetrack erosion profile on the central cathode target;
   a first magnetic component for guiding a first arc that forms the first racetrack erosion profile; and
   a second magnetic component for guiding a second arc that forms the second racetrack erosion profile, wherein the first magnetic component and the second magnetic component are located within the central cathode target, wherein the first anode and the second anode are equally spaced around the central cathode target on opposite sides of the central cathode target, wherein each of the first and second anodes is separated by an angle of about 180°; and
   wherein the central cathode target rotates about a longitudinal axis of the central cathode target and each of the first and second anodes rotates about a respective longitudinal axis.

2. The arc deposition system of claim 1 further comprising a controller.

3. The arc deposition system of claim 2 further comprising a power supply system for biasing each of first anode and the second anode with respect to the central cathode target.

4. The arc deposition system of claim 3, wherein the power supply system includes a power supply subsystem to positively bias each anode of the first anode and the second anode with respect to the central cathode target.

5. The arc deposition system of claim 4, wherein the controller is configured to simultaneously activate each anode.

6. The arc deposition system of claim 5, wherein the controller is configured to activate the first anode and the second anode in an alternating manner.

7. The arc deposition system of claim 3, wherein each anode is positively biased with respect to the central cathode target with a DC voltage between −15 and −50 volts.

8. The arc deposition system of claim 7, wherein a current from 100 to 600 amps flows through each anode.

9. The arc deposition system of claim 3 further comprising a striker for each anode to initiate an arc.

10. The arc deposition system of claim 1 wherein the coating chamber is at an operating pressure between 0.5 and 50 mTorr.

* * * * *